(12) United States Patent
Nakamura et al.

(10) Patent No.: US 8,438,527 B2
(45) Date of Patent: May 7, 2013

(54) ORIGINAL PLATE EVALUATION METHOD, COMPUTER READABLE STORAGE MEDIUM, AND ORIGINAL PLATE MANUFACTURING METHOD

(75) Inventors: Satomi Nakamura, Yokohama (JP); Toshiya Kotani, Machida (JP); Kazuhito Kobayashi, Chigasaki (JP); Akiko Mimotogi, Yokohama (JP); Chikaaki Kodama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/426,965

(22) Filed: Mar. 22, 2012

(65) Prior Publication Data

US 2013/0055172 A1    Feb. 28, 2013

(30) Foreign Application Priority Data

Aug. 26, 2011 (JP) ................. 2011-184896

(51) Int. Cl.
  *G06F 17/50* (2006.01)
(52) U.S. Cl.
  USPC ............. 716/136; 716/50; 716/51; 716/52; 716/53; 716/54; 716/55; 716/56; 716/122; 716/132; 716/139

(58) Field of Classification Search .............. 716/50–56, 716/122, 132, 136, 139; 430/5, 30
See application file for complete search history.

(56) References Cited

U.S. PATENT DOCUMENTS

| | | | |
|---|---|---|---|
| 7,090,949 B2 | 8/2006 | Nojima et al. | |
| 7,266,801 B2 * | 9/2007 | Kotani et al. | 716/52 |
| 7,550,237 B2 * | 6/2009 | Wang | 430/30 |
| 8,023,723 B2 | 9/2011 | Ito | |

FOREIGN PATENT DOCUMENTS

| | | |
|---|---|---|
| JP | 2002-244275 | 8/2002 |
| JP | 2004-184633 | 7/2004 |
| JP | 2009-122199 | 6/2009 |

* cited by examiner

*Primary Examiner* — Nghia Doan
(74) *Attorney, Agent, or Firm* — Oblon, Spivak, McClelland, Maier & Neustadt, L.L.P.

(57) ABSTRACT

According to one embodiment, an original plate evaluation method is disclosed. The original plate includes a substrate and N patterns differing from one another in shape. The method includes selecting N1 patterns from the N patterns based on first criterion, obtaining measured values for the N1 patterns, performing a decision whether the obtained measured values satisfy first specification value, selecting N2 patterns from the N patterns based on second criterion, predicting shapes of transfer patterns corresponding to N2 patterns, performing a decision whether the predicted shapes satisfy second specification value, and evaluating the plate based on the decision.

14 Claims, 7 Drawing Sheets

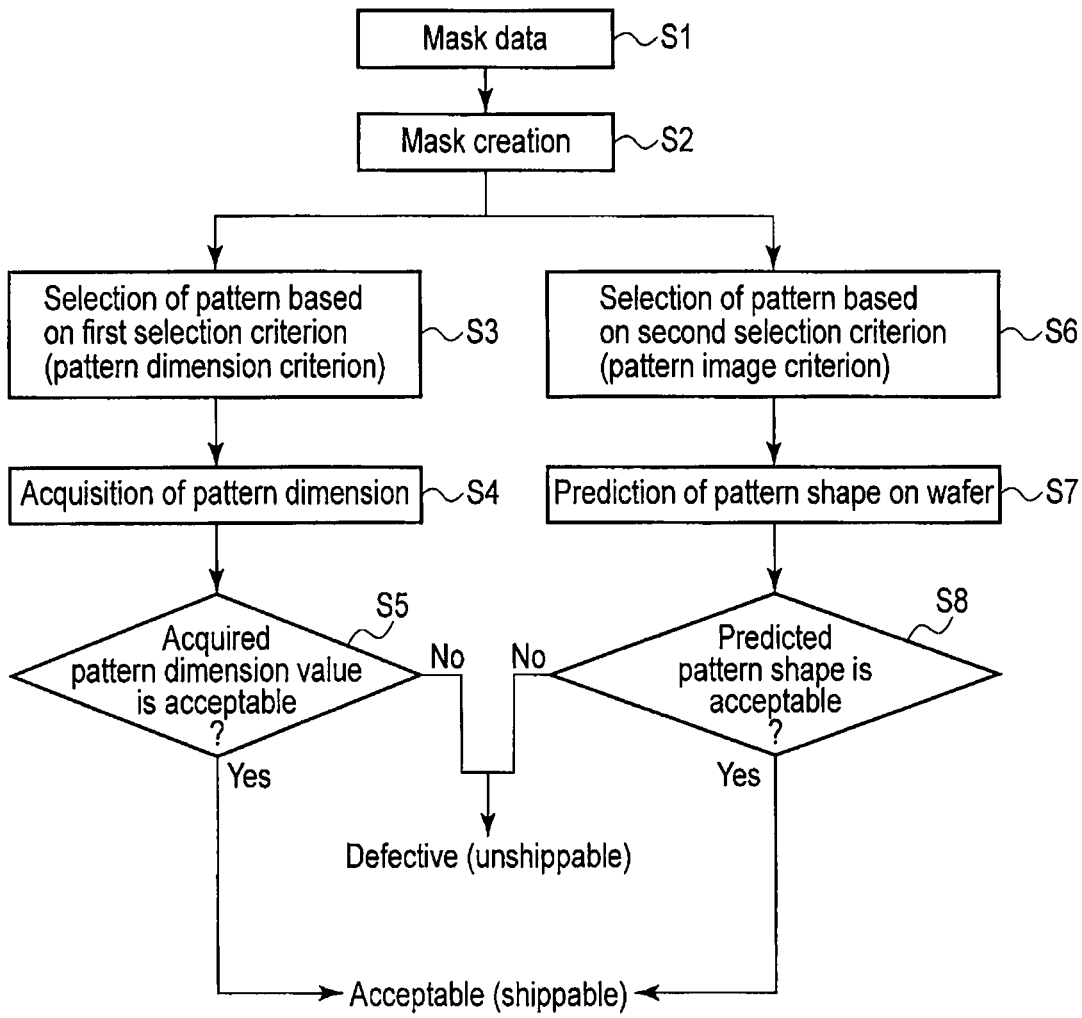
F I G. 1

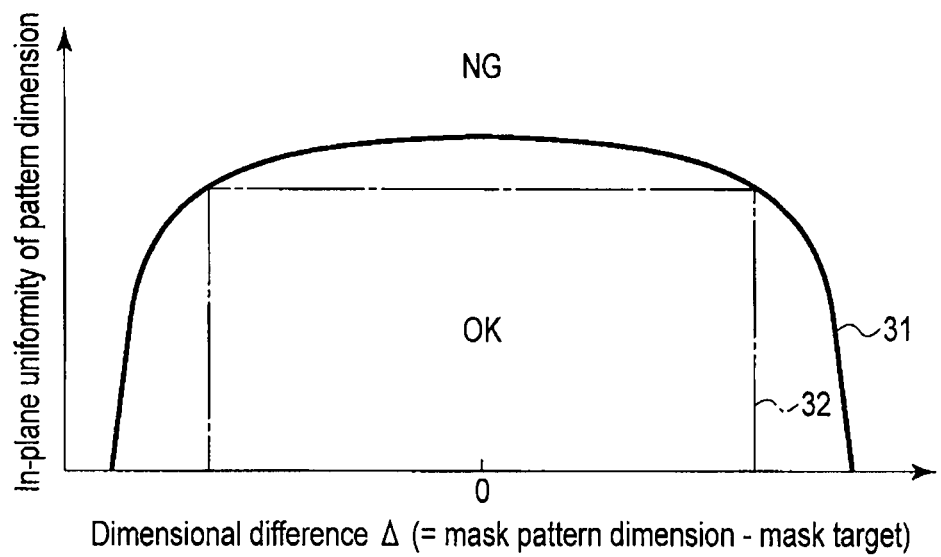
F I G. 4
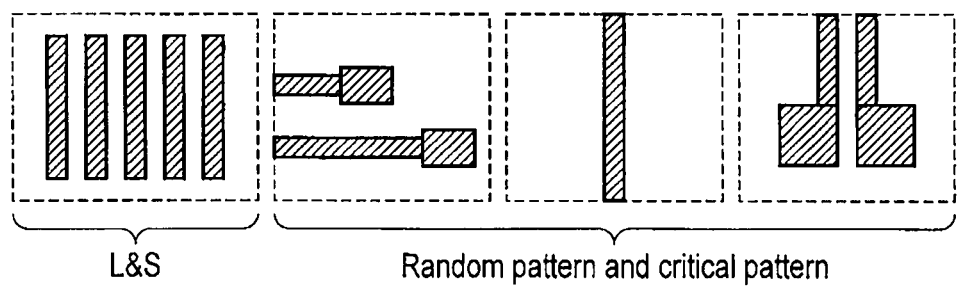
F I G. 5

ORIGINAL PLATE EVALUATION METHOD, COMPUTER READABLE STORAGE MEDIUM, AND ORIGINAL PLATE MANUFACTURING METHOD

CROSS-REFERENCE TO RELATED APPLICATIONS

This application is based upon and claims the benefit of priority from prior Japanese Patent. Application No. 2011-184896, filed Aug. 26, 2011, the entire contents of which are incorporated herein by reference.

FIELD

Embodiments described herein relate generally to an original plate evaluation method for evaluating an original plate of a mask or the like which is used to manufacture a semiconductor device, a computer readable storage, and an original plate manufacturing method.

BACKGROUND

In recent years, dimensional accuracy for photomasks has been rapidly becoming stricter; for example, in-plane dimensional uniformity for photomasks is at most 10 nm. In the steps of manufacturing a photomask, there are many items for determining whether the photomask is acceptable or defective. In the conventional art, if any of the items fails to meet a relevant specification, the photomask is determined to be defective. Thus, the current demanding dimensional accuracy for photomasks inevitably contributes to reducing the yield of photomasks.

Such judgment specifications for photomasks as described above are conventionally determined such that exposure latitude can be achieved even if all the items used for the judgment barely fall within the ranges of specification values. However, for actually created photomasks, it is very rare that all the items barely fall within the ranges of the specification values. Even if any of the items deviates from the range of the specification value, the other items often fall within the ranges of the specification values so as to have the exposure latitude. Thus, the exposure latitude can be achieved even by some of the photomasks for which any of the items deviates from the range of the specification value and which are then determined to be defective and disposed of. That is, even if any of the items for a photomask deviates from the specification values, the photomask may generally achieve the exposure latitude if the other items fall within the ranges of the specification values so as to have the exposure latitude.

Thus, several methods have been proposed in order to avoid above the mask acceptability determination, in which even the mask having a potential to present the exposure latitude is determined defective.

BRIEF DESCRIPTION OF THE DRAWINGS

FIG. 1 is a flowchart illustrating a method for manufacturing a mask according to an embodiment;

FIG. 4 is a diagram showing an example of a dimensional specification;

FIG. 5 is a diagram showing an example of L&S, a random pattern, and a critical pattern;

DETAILED DESCRIPTION

Figure 2:
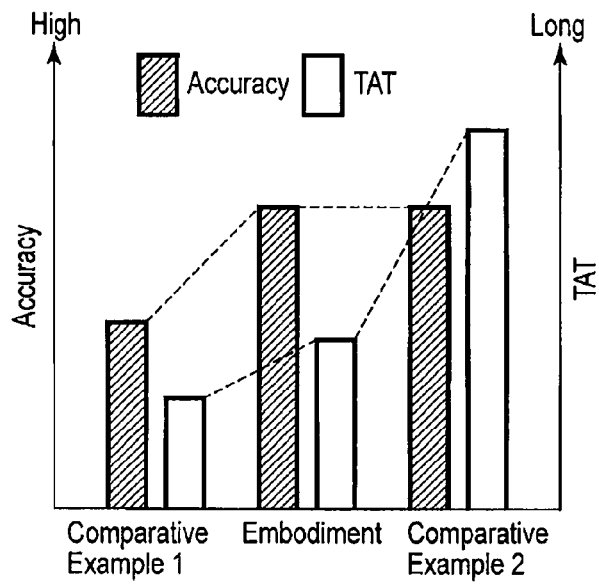
FIG. 2 is a diagram illustrating TAT and mask guaranteed accuracy of an embodiment and those of comparative examples 1 and 2.

An embodiment will be described below with reference to the drawings.

In general, according to one embodiment, an original plate evaluation method for evaluating an original plate is disclosed. Here, the original plate includes a substrate and a plurality of patterns provided on the substrate and corresponding to a plurality of circuit patterns to be formed on a semiconductor substrate. The plurality of patterns include N (N≧2) patterns differing from one another in at least one of a shape and an arrangement position in the substrate. The method includes selecting N1 patterns from the N patterns (N1≦N) based on a first selection criterion; acquiring measured values for the N1 patterns; performing a first determination configured to determine whether or not the acquired measured values satisfy a first specification value. The method further includes selecting N2 patterns from the N patterns (N2≦N) based on a second selection criterion; predicting shapes of transfer patterns corresponding to the N2 patterns to be transferred onto the semiconductor substrate, the predicting shapes of transfer patterns comprising acquiring images relating to the N2 patterns, and predicting the shapes of the transfer patterns based on the acquired images. The method further includes performing a second determination configured to determine whether or not the predicted shapes of the transfer patterns (hereinafter referred to as predicted shapes) satisfy a second specification value; and evaluating the original plate based on the first determination and the second determination.

First Embodiment

FIG. 1 is a flowchart illustrating a method for manufacturing a mask according to a first embodiment. In the description of the present embodiment, a mask (original plate) is a photomask (transmission-type mask).

Mask data on a photomask for use in lithography for semiconductor manufacture is prepared (step S1). A photomask is created based on the mask data (step S2). The photomask comprises a transparent substrate and a plurality of patterns formed on the transparent substrate. The plurality of patterns include a plurality of (N) patterns that differ from one another in at least one of size and shape. The N patterns belong to, for example, patterns forming a circuit.

Next, based on a first selection criterion in which pattern types are associated with items for measurement of a manufacturing variation in the mask pattern, N1 patterns are selected from the N patterns (N1<N) (step S3).

Here, the pattern types include, for example, a line and space pattern (hereinafter referred to as L&S) and a hole pattern. The items for measurement of a manufacturing variation include, for example, the average value of the pattern dimension. In the description of the present embodiment, the item for measurement of a manufacturing variation is an item related to the pattern dimension such as the average value of the pattern dimension, by way of example.

Next, the N1 patterns are measured using a measurement instrument, for example, SEM, and the pattern dimension is acquired based on the results of the measurement (step S4). For example, if L&S is measured, line width is measured at specified positions in a mask plane, and the average of the measured values is determined.

Next, the method determines whether or not the value of each of the pattern dimensions acquired is acceptable (step S5). The determination (acceptability determination based on the pattern dimension) is based on a pre-created dimensional specification (first judgment criterion) describing the acceptable range of values of the pattern dimension.

If the determination in step S5 results in "No" for any of the N1 patterns, for example, the photomask is determined to be defective (unshippable). On the other hand, if the determination results in "Yes" for all the patterns, the photomask is determined to be acceptable (shippable).

However, if the number of the patterns for which the determination results in "No" is equal to or smaller than a given value, the step of determining the photomask to be defective (unshippable) may be replaced with a step of correcting or changing the patterns in the determination results in "No".

Next, based on a second selection criterion specifying patterns to be judged based on images, N2 patterns are selected from the N patterns (N2<N) (step S6).

In general, the N2 patterns and the N1 patterns are selected so as to avoid duplications. However, the N2 patterns and the N1 patterns may be duplicative, a calculation time is not so long.

Patterns to be judged based on images as specified by the second selection criterion are divided into, for example, the following two groups (classification guideline).

Group 1

Group 1 includes patterns for which a master target (a dimension specified in data) deviates significantly from the corresponding finished dimension of a photomask. For example, group 1 includes corner portions of patterns, SRAF (Sub Resolution Assist Feature) patterns, hole patterns, and patterns with shapes (for example, complicated shapes) resulting from OPC (Optical Proximity Correction). SRAF is used for, for example, 40-nm generation devices. Patterns corresponding to SRAF (SRAF patterns) are originally not formed on a wafer. However, SRAF patterns may be formed on a wafer. In this case, the SRAF patterns may affect original patterns (for example, gate patterns) on the wafer.

Group 2

Group 2 includes patterns for which the deviation between the master target and the corresponding finished dimension of the mask significantly affects the dimensions of the patterns on the wafer. Group 2 includes, for example, patterns with significant MEFs (Mask Error Factors) and patterns with low light intensity contrasts.

That is, patterns for which the acceptability is determined based on pattern images for which are accurate determination of acceptability. Thus, the present embodiment adopts a technique to determine acceptability based on pattern images preferentially for patterns for which acceptability cannot be accurately determined based on the pattern dimension.

In contrast, patterns for which the acceptability is determined based on the pattern dimension include, in addition to L&S (one-dimensional pattern), patterns which are not one-dimensional but for which the deviation between the master target and the corresponding finished dimension of the mask is equivalent to that in L&S and patterns fixed in the generation such as a cell portion of a memory chip.

Here, the generation refers to a group of products with the same memory cell dimensions (the gate length and gate width of memory cells). In the group of products, initially shipped products are referred to as mother products, and products shipped after the mother products are referred to as derivatives. For example, high-capacity products that are mother products are shipped, and then low-capacity products that are derivatives are shipped. Here, the mother product and the derivative often have the same cell portion (the above-described "fixed pattern").

In a chip such as a memory chip, whether or not patterns varying depending on the product type as in the case of derivatives (for example, patterns for a sense amplifier) are acceptable is determined based on pattern images. This is because a selection criterion is prepared for each product if the acceptability is determined based on the pattern dimension. For a similar reason, the acceptability is determined, based on pattern images, for a pattern for a hookup area that connects a pattern varying depending on the product type and a pattern fixed in the generation.

Next, images relating to the above-described N2 patterns (hereinafter referred to as pattern images) are acquired. Based on the pattern images, the shapes of patterns (for example, resist patterns) corresponding to the N2 patterns formed on (transferred onto) a wafer are predicted in accordance with a well-known method (for example, lithography simulation) (step S7). The patterns formed on (transferred onto) the wafer is hereinafter referred to as wafer patterns.

The above-described shape includes information on the shape and dimensions of the pattern. Furthermore, the above-described pattern image is, for example, an image of the pattern acquired using the measurement instrument such as SEM, the contour of the pattern obtained by processing the image, or the planar or vertical shape of the pattern acquired using the measurement instrument.

Next, the method determines whether or not the predicted shape of each of the wafer patterns is acceptable (step S8). The determination is based on, for example, a pre-created shape specification (second judgment criterion) describing the range of acceptable shapes.

If the determination in step S8 results in "No" for any of the N2 patterns, the photomask is determined to be defective (unshippable). On the other hand, if the determination results in "Yes" for all the patterns, the photomask is determined to be acceptable (shippable).

However, when the number of the patterns for which the determination results in "No" is equal to or smaller than a given value, the step of correcting or changing the patterns for which the determination results in "No" may be additionally carried out instead of the step of determining the photomask to be defective (unshippable).

If the determination results in "No" for any of the patterns in at least one of steps S5 and S6, then the photomask is determined to be, for example, defective (unshippable).

However, if the number of the patterns for which the determination results in "No" is equal to or smaller than a given value, the step of correcting or changing the patterns for which the determination results in "No" may be additionally carried out instead of the step of determining the photomask to be defective (unshippable).

According to the present embodiment, steps S3 and S6 allows the appropriate classification into patterns for which the acceptability is determined based on the pattern dimension and patterns for which the acceptability is determined based on the pattern image. This enables the maintenance of the advantage (mask guaranteed accuracy) of the method for determining whether or not the mask is acceptable based on the pattern image and the utilization of the advantage (reduced determination time) of the method for determining whether or not the mask is acceptable based on the pattern dimension. Thus, time for semiconductor manufacture (TAT (Turn Around Time) can be reduced while the yield of photomask manufacture can be prevented from being reduced.

FIG. 2 is a diagram illustrating TAT and mask guaranteed accuracy of the present embodiment and those of comparative examples 1 and 2. Comparative example 1 is a method for determining acceptability based on the pattern dimension. Comparative example 2 is a method for determining acceptability based on the pattern image. FIG. 2 indicates that the present embodiment allows the maintenance of the photomask guaranteed accuracy and a reduction in TAT.

Figure 3:
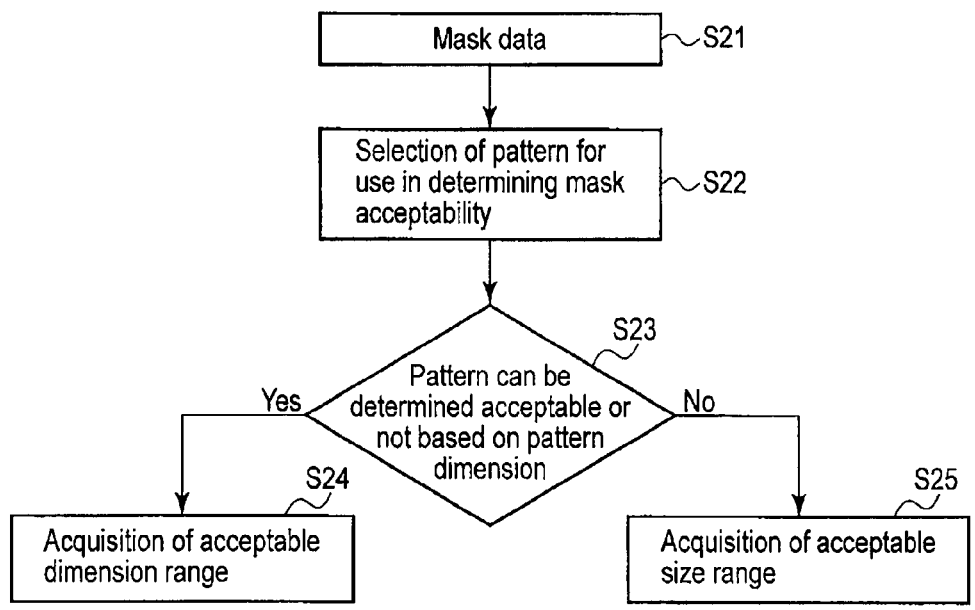
FIG. 3 is a flowchart illustrating a method for creating judgment criteria (dimensional specification and shape specification) according to an embodiment.

FIG. 3 is a flowchart illustrating a method for creating judgment criteria (dimensional specification and shape specification) on an embodiment.

Master data is prepared (step S21). A plurality of patterns (mask patterns) for use in determining whether or not the mask is acceptable are selected from the master data (step S22).

Next, the method determines whether or not each of the plurality of patterns has a portion (for example, the width of one-dimensional patterns such as the line width of L&S for memory cells) that can be utilized to determine whether or not the corresponding pattern dimension value (for example, the average value of the pattern dimension) is acceptable (step S23). For example, step S23 may be said that it determines whether the pattern is based on the first selection criterion illustrated in step S3.

If the determination in step S23 results in "Yes", an acceptable range (acceptable dimension range) of the portion of the pattern for the determination results in "Yes" is acquired, in which the acceptable dimension range corresponds to the acceptable range of the pattern dimension (step S24). An example will be described below in brief.

First, original patterns to be drawn on the mask are prepared. The patterns comprise what is called design data on which OPC (Optical Proximity Correction) processing is carried out and is drawn on the mask with electron beams. For instance, if the pattern is a pattern of memory product, a pattern in L&S patterns of memory cells is subjected to the OPC processing, and the pattern subjected to the OPC processing (hereinafter referred to as input patterns) is used for simulation to create so called an ED tree, in which the simulation is performed under the condition that the exposure amount and focus are repeatedly changed within the ranges. The lithography margin is calculated, for example, by opening an elliptic window on the ED tree (hereinafter referred to as Litho margin).

Next, it is assumed that the patterns drawn on the mask with electron beams vary. The previously input patterns are increased by X1 [nm] in thickness. Then, as described above, an ED tree is created, and the lithography margin is calculated. The lithography margin is slightly smaller than that of the input patterns with the original dimensions. This is because lithography conditions are determined such that the lithography margin is greatest for the original dimensions. That is, when the input patterns as a whole increase or decrease by X1 [nm] in thickness, the lithography margin becomes gradually smaller than that for the original dimension.

Moreover, ED trees are created for the patterns increased and reduced by x2 [nm] in thickness, and a lithography margin common to both patterns is determined. Based on this result and the calculations of the lithography margins resulting from the increase and reduction in thickness by X2 [nm], for example, such a graph as shown in FIG. 4 is created. This is a criterion for the determination of acceptability of the mask (satisfaction of the exposure latitude specification on the wafer).

A method for determining acceptability (step S5) in this case will be described. For example, in accordance with the above-described example, patterns of memory cells in an actually created mask are subjected to multiple points length measurement by SEM, then the deviation between the average value of the measured values and the original dimension of the input pattern is calculated, furthermore the variation of the results of the length measurements is determined, and a graph in FIG. 4 is created. The determination of acceptability (step S5) is made depending on whether the value lies inside an area 31 (OK area) enclosed by a contour satisfying the exposure latitude specification. If the value lies inside the OK area 31, the determination results in "Yes". Otherwise, the determination results in "No". In FIG. 4, an area 32 is a rectangular OK area corresponding to a fixed specification. An area outside the area 32 can be simply determined to an area failing to satisfy the required exposure tolerance (NG area). Furthermore, in FIG. 4, the axis of abscissas indicates a "dimensional difference Δ (=mask pattern dimension−mask target)". The axis of ordinate indicates the "in-plane uniformity of the pattern dimension".

Figure 6A:
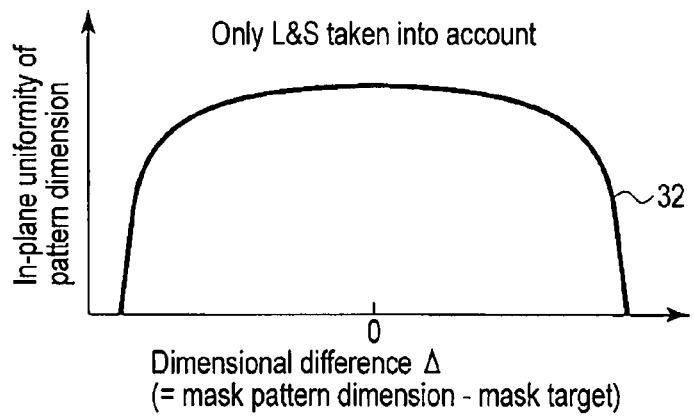
FIG. 6A is a diagram showing a selection criterion based on a pattern dimension with only L&S taken into account.
Figure 6B:
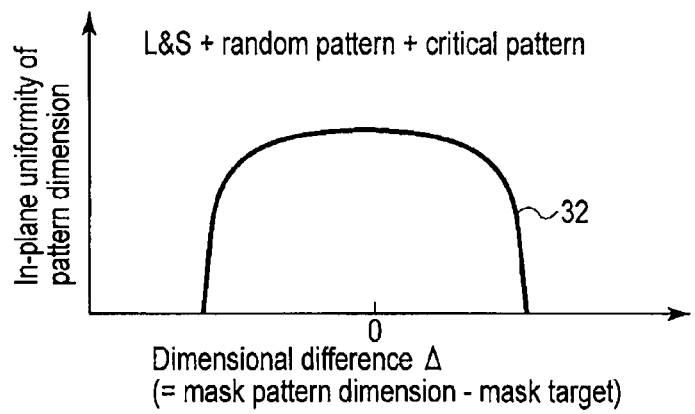
FIG. 6B is a diagram showing a selection criterion based on a pattern dimension with the L&S, random pattern, and critical pattern taken into account.

When a graph to be judgment criterion of FIG. 4 is created, by taking into account random patterns and critical patterns in terms of lithography (hot spots), for example, as shown in FIG. 5, in addition to L&S (patterns used for calculation of general dimensional specifications), the accuracy of mask acceptability determination can be improved, as shown in FIG. 6A and FIG. 6B.

Furthermore, the judgment criterion for the pattern dimension specification may be created based on the items for measurement of the manufacturing variation of the mask patterns other than the average value of the pattern dimension, for example, a variation of pattern dimension, an average value of a pattern drawing position, a variation of the pattern drawing position, an average value of transmissivity, and a variation of the transmissivity, an average value of phase difference, and a variation of the phase difference. Moreover, at least two of these items (including the average value of the pattern dimension) may be used to create dimensional specifications. In this case, degradation amount of lithography margin caused by at least two items is calculated, and the acceptability is determined depending on whether the degradation amount is within the lithography margin.

For the patterns other than simple ones such as L&S, the acceptability determination based on the pattern dimension (step S5) may lack consideration for a variation of the patterns drawn on the mask.

However, in the present embodiment, the object for which the acceptability is determined based on the pattern dimension is simple patterns such as L&S selected based on the first selection criterion. That is, simple patterns such as L&S may be exclusively taken into account, and the variation of the patterns drawn on the mask need not be considered.

On the other hand, if the determination in step S23 results in "No", the range of shapes (acceptable shape range) of the patterns determined "No" is acquired, wherein the range corresponds to a range of acceptable shapes of the wafer pattern (step S25). An example will be described below in brief.

An image of an actually drawn mask pattern is acquired, and contour data on the mask pattern is determined based on the image. Lithography simulation (calculation) is carried out using the contour data to predict a pattern shape on the wafer (a wafer pattern shape). Then, the acceptability determination based on the wafer pattern shape is carried out using the graph (step 8).

In this case, whether or not the mask is acceptable can be accurately determined even for patterns other than simple ones such as L&S. However, a series of operations of acquiring an image, determining contours, and carrying out simulation takes long time. Thus, whether or not the mask is acceptable to the mask for all the pattern variations on the mask takes a long time because of included SEM acquisition time and calculation time.

However, in the present embodiment, the object of the acceptability determination based on the wafer pattern shape is limited to the patterns for which the acceptability cannot be accurately determined based on the pattern dimension. The present embodiment thus allows masks to be manufactured (evaluated) in a shorter time than the conventional art.

Furthermore, the mask evaluation method of the embodiment corresponds to the method illustrated in FIG. 1 and in which step S1 and step S2 are replaced with a step of preparing a pre-created mask. The mask prepared is the same as that obtained in step S2.

Second Embodiment

Figure 7:
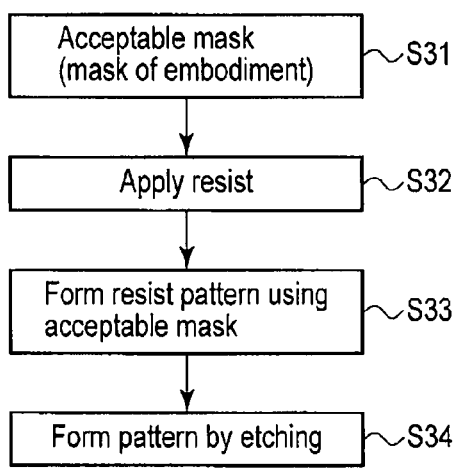
FIG. 7 is a flowchart illustrating a method for manufacturing a semiconductor device according to an embodiment.

FIG. 7 is a flowchart illustrating a method for manufacturing a semiconductor device according to a second embodiment.

First, a mask determined to be acceptable based on the mask evaluation method according to the first embodiment (the mask of the embodiment) is prepared (step S31).

Next, resist is applied on a substrate including a semiconductor substrate (step S32). The semiconductor substrate is, for example, a silicon substrate or an SOI substrate.

Next, the mask of the embodiment is placed above the substrate, and the resist is irradiated with light or charged beams via the mask. The resist is thereafter developed to form a resist pattern on the substrate (step S23).

Next, the substrate is etched by using the resist pattern as a mask to form a pattern corresponding to the resist pattern (step S34).

Here, if an underlying layer of the resist (the uppermost layer of the substrate) is a polycrystalline silicon film or a metal film, an electrode pattern, a wiring pattern, and the like are formed. If the underlying layer of the resist (the uppermost layer of the substrate) is an insulating film, a contact hole pattern, a gate insulating film, and the like are formed. If the underlying layer of the resist is the semiconductor substrate, an isolation trench (STI) and the like are formed.

A semiconductor device is manufactured by repeatedly preparing the mask according to the embodiment (step S31), applying the resist (step S32), forming the resist pattern using the mask of the embodiment (step S33), and forming the patterns by etching (step S34) as described above.

Third Embodiment

Figure 12:
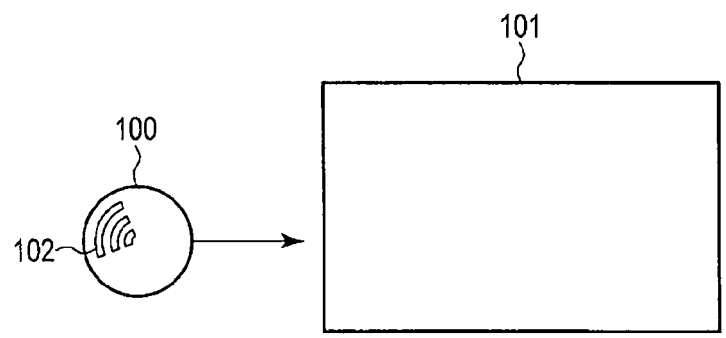
FIG. 12 is a diagram schematically showing a computer readable storage medium according to an embodiment.

The method according to the first embodiment can be implemented as a computer readable storage medium. That is, as shown in FIG. 12, a computer readable storage medium 100 according to the present embodiment comprises a program 102 recorded therein to allow a computer 101 to carry out (some or all of) the steps (or instructions) of the method according to the first embodiment. The steps of the method in the first embodiment may be carried out by the computer as means or a procedure. The computer readable storage medium according of the present embodiment may be incorporated into a mask manufacturing apparatus, a mask evaluation apparatus, or the like.

First, a program (first program) will be described which allows the computer to carry out the steps S21 to S25 of the method for creating the judgment criterion of the embodiment as functions.

Information processing by the first program is specifically implemented using, for example, a control device of a mask manufacturing apparatus or a mask evaluation apparatus, as a hardware resource. The control device includes a calculation circuit serving as the computer. The calculation circuit includes CPU and an internal storage section. The calculation circuit may use an external storage section. If the internal storage section and the external storage section hereinafter need not be distinguished from each other, both storage sections are simply collectively referred to as a storage section. CPU reads in data from inside the storage section and caries out steps S21 to S25 on the data as functions. The results of the functions may be temporarily saved in the storage section and may read out from the storage section for other functions. The first program will be described below in further detail taking the control device as an example.

Figure 8:
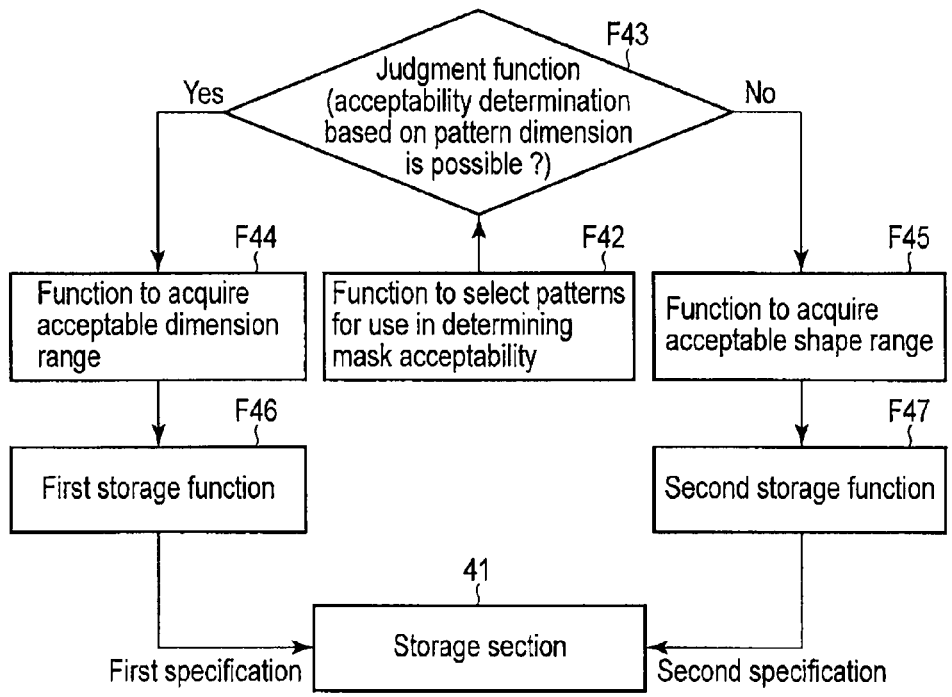
FIG. 8 is a functional block diagram illustrating functions of a first program according to an embodiment.

FIG. 8 is a functional block diagram illustrating the functions of the first program.

The first program is intended to allow the calculation circuit in the control device to implement functions F41 to F47 described below.

The function 41 is configured to load master data, which is input in the mask manufacturing apparatus or the mask evaluation apparatus, into a storage section 41 of the control device.

The function F42 is configured to select a plurality of patterns (mask patterns) to be used for the mask acceptability determination from the mask data.

The function F43 is configured to determine whether or not each of the plurality of patterns includes a portion that can be used to determine whether or not the value of the pattern dimension is acceptable.

The function F44 is configured to be operative when the determination by the function F43 results in "Yes" and configured to acquire the acceptable dimension range (first specification based on the first judgment criterion) corresponding to the range of acceptable values of the pattern dimension corresponding to the shape for which the determination results in "Yes".

The function F45 is configured to be operative when the determination by the function F43 results in "No" and configured to acquire the range of shapes for which the determination results in "No" (acceptable shape range) wherein the acceptable shape range corresponds to the range of acceptable shapes of the wafer pattern.

The function F46 (first storage function) is configured to allow the storage section 41 to store the first specification acquired by the function F44, in association with the shape for which the determination results in "Yes".

The function F47 (second storage function) is configured to allows the storage section 41 to store the acceptable shape range acquired by the function F45, in association with image data, as a second specification.

Figure 9:
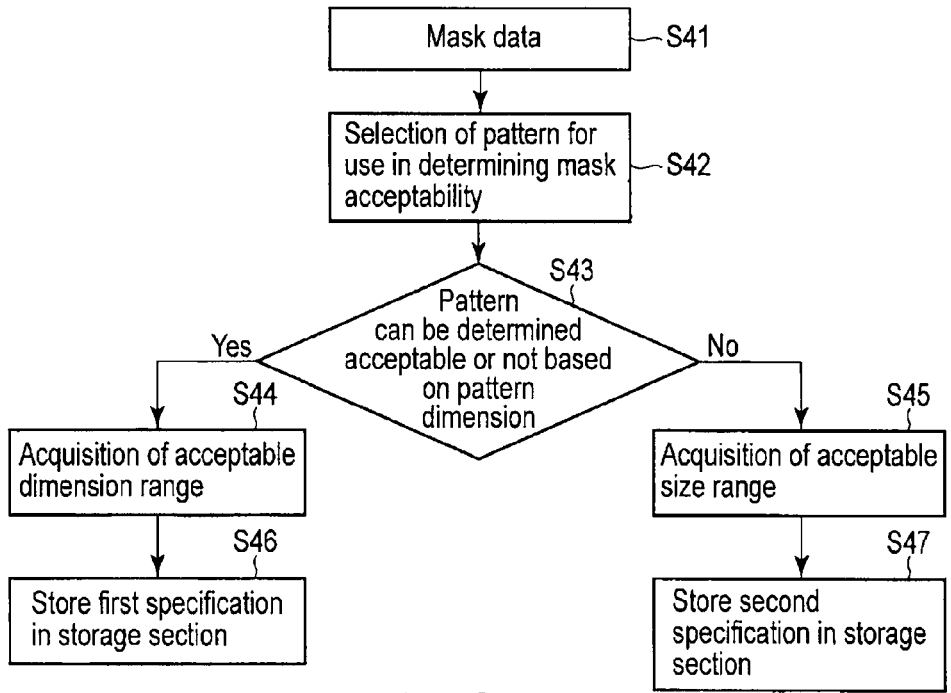
FIG. 9 is a flow diagram illustrating processing of the first program according to an embodiment.

FIG. 9 is a flow diagram illustrating the processing of the first program.

When mask data is input to a control device 40, the mask data is loaded into the storage section 41 by the function 40 (step S41).

A plurality of patterns (mask patterns) to be used for mask acceptability determination are selected from the mask data by the function F42 of the first program (step S42, the function F42).

The function F43 of the first program determines whether or not each of the plurality of patterns includes a portion (which corresponds to, for example, the width of one-dimensional patterns such as the line width of L&S for memory cells) that can be used to determine whether or not the value of the pattern dimension (for example, a CD mean value) is acceptable (step S43).

Here, if the determination by the function F43 results in "Yes", the function 44 of the first program allows the acquisition of the acceptable dimension range (the specification based on the first judgment criterion) corresponding to the range of acceptable values of the pattern dimension corresponding to the shape for which the determination results in "Yes" (step S44). Thereafter, the function F46 of the first program allows the storage section 41 to store the first specification based on the first judgment criterion, in association with the shape for which the determination results in "Yes" (step S46). The storage section 41 may be removable from the control device.

On the other hand, if the determination by the function F43 results in "No", the function F45 of the first program allows the acquisition of the range of shapes for which the determination results in "No" (acceptable shape range) wherein the acceptable shape range corresponds to the range of acceptable shapes of the wafer pattern (step S45). For example, the function F45 has a function to allow the acquisition of an image of an actually drawn mask pattern stored in the storage section 41 and to obtain contour data on the mask pattern from the image. The function F45 further has a function to obtain a acceptable wafer pattern dimension or shape based on a processing or a device condition. The function F47 of the first program allows the storage section 41 to store a range of the acceptable wafer pattern dimension or shape in association with the image data as a second specification (step S47).

Next, a program (second program) will be described which allows the computer to carry out the steps S3 to S8 of the method for manufacturing the mask of the embodiment as shown in FIG. 1. The first program and the second program may be provided as separate programs or as a single program.

Information processing by the first program is specifically implemented using, for example, a mask inspection apparatus as a hardware resource. The mask inspection apparatus comprises a calculation circuit serving as the computer. The calculation circuit comprises CPU and an internal storage section. The calculation circuit may use an external storage section. If the internal storage section and the external storage section hereinafter need not be distinguished from each other, both storage sections are simply collectively referred to as a storage section. CPU reads in data from inside the storage section and caries out steps S3 to S8 on the data as functions. The results of the functions may be temporarily saved in the storage section and may read out from the storage section for other functions. The second program will be described below in further detail.

Figure 10:
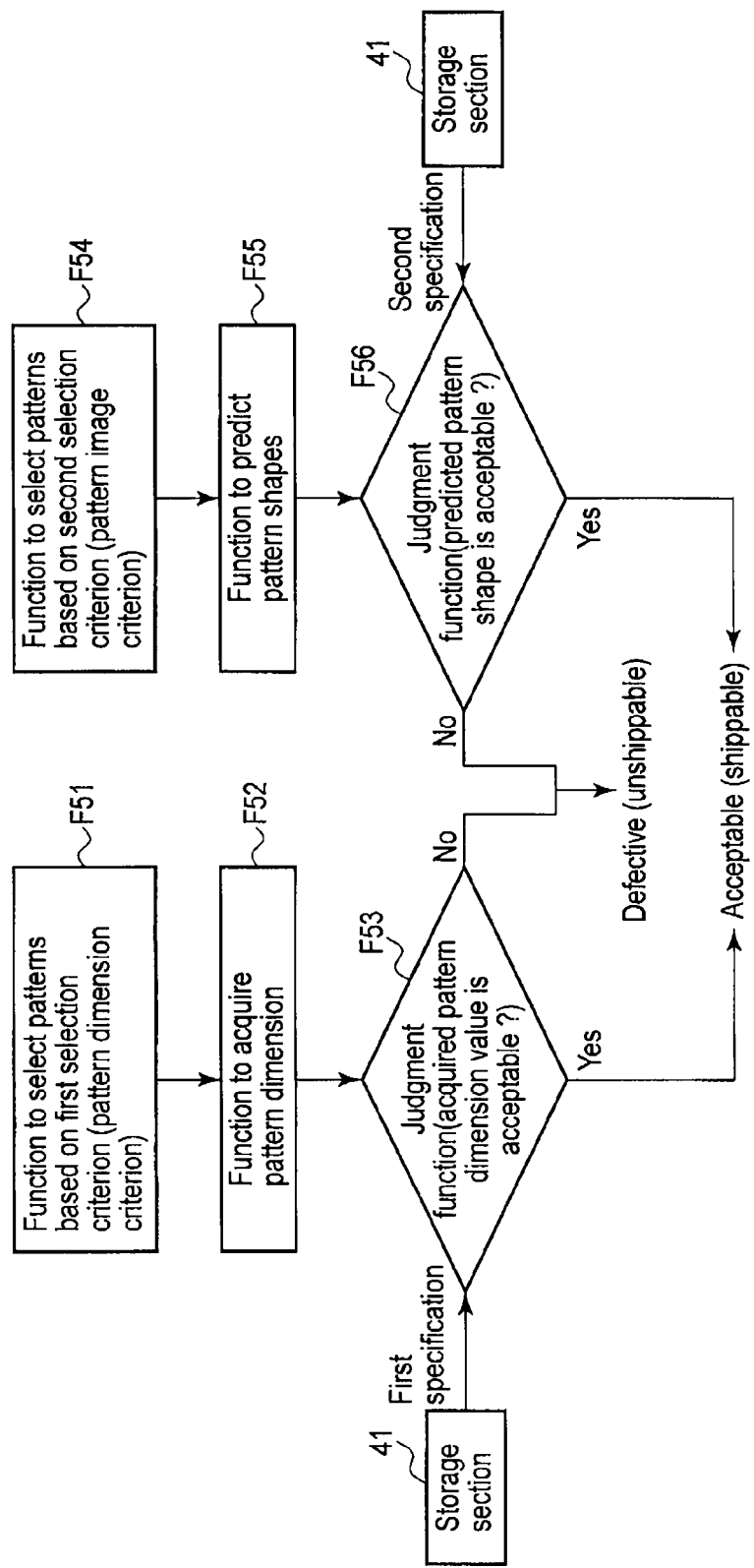
FIG. 10 is a functional block diagram illustrating functions of a second program according to an embodiment.

FIG. 10 is a functional block diagram illustrating the functions of the second program.

The first program is intended to allow the calculation circuit in the mask inspection apparatus to implement functions F51 to F56 described below.

The function F51 is configured to select N1 patterns from the N patterns (N1<N) based on the first selection criterion in which the pattern types are associated with the items for measurement of the manufacturing variation of the pattern.

The function F52 is configured to acquire the pattern dimension based on the results of measurement of the N1 patterns acquired using the measurement instrument such as SEM.

The function F53 is configured to determine whether or not the acquired value of the pattern dimensions is acceptable based on the first specification stored in the storage section 41 in FIG. 8.

The function F54 is configured to select N2 patterns from the N patterns (N2<N) based on the second selection criterion in which the pattern to be judged based on images is specified.

The function F55 is configured to predict the shapes of patterns (for example, resist patterns) corresponding to the N2 patterns to be formed on (transferred onto) the wafer based on the acquired images (pattern images) relating to the N2 patterns.

The function F56 is configured to determine whether or not the acquired value of predict the shapes of patterns is acceptable based on the second specification stored in the storage section 41 in FIG. 8.

Figure 11:
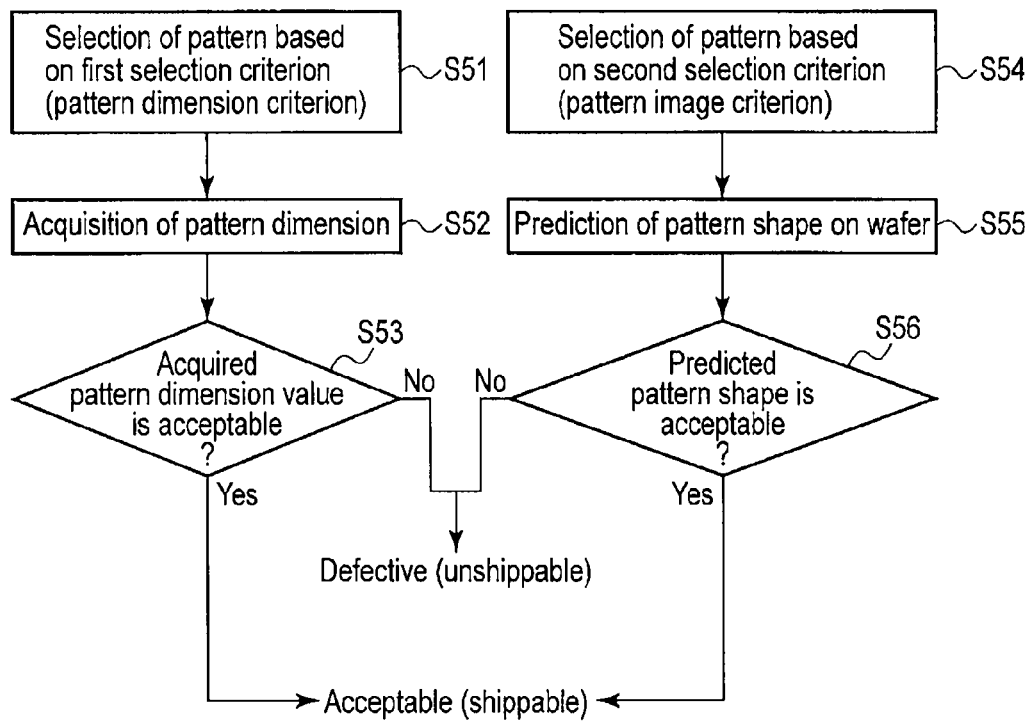
FIG. 11 is a flow diagram illustrating processing of a second program according to an embodiment.

FIG. 11 is a flow diagram illustrating the processing of the second program.

For the mask including the N patterns formed in step S2 in FIG. 1, the function F51 of the second program allows the calculation circuit to select N1 pattern from the N patterns (N1<N) based on the first selection criterion in which the pattern types are associated with the items for measurement of the manufacturing variation of the pattern (step S51). In the description of the present embodiment, the item for measurement of the manufacturing variation is an item (pattern dimension) related to the dimension such as the average value of the pattern dimension, by way of example.

The function F52 of the second program allows the calculation circuit to acquire the pattern dimension based on the results of measurement of the N1 patterns acquired using the measurement instrument such as SEM (step S52).

The function F53 of the second program allows the calculation circuit to determine whether or not the acquired value of the pattern dimensions is acceptable based on the first specification stored in the storage section 41 in FIG. 8 (step S54).

If the determination by the function F53 results in "No" for any of the N1 patterns, then for example, the mask is determined to be defective (unshippable). On the other hand, if the determination by the function F53 results in "Yes" for all the patterns, the mask is determined to be acceptable (shippable).

The function F54 of the second program allows the calculation circuit to select N2 pattern from the N patterns (N2<N) based on the second selection criterion in which the pattern to be judged based on images is specified (step S54).

The function F55 of the second program allows the calculation circuit to predict the shapes of patterns (for example, resist patterns) corresponding to the N2 patterns to be formed on (transferred onto) the wafer based on the acquired images (pattern images) relating to the N2 patterns (step S55).

The function F56 allows the calculation circuit to determine whether or not the acquired value of the pattern shapes is acceptable based on the second specification stored in the storage section 41 in FIG. 8 (step S56).

If the determination by the function F56 results in "No" for any of the N2 patterns, then the mask is determined to be defective (unshippable). On the other hand, if the determination by the function F56 results in "Yes" for all the patterns, the mask is determined to be acceptable (shippable).

As described above, saving the first specification and the second specification as data allows creation of the first specification for the cell portion of the derivative to be omitted. This enables a reduction in the time creating specifications. Furthermore, image data for previous generations can be stored.

The present invention is not limited to the above-described embodiments. For example, the embodiments have been described in conjunction with the photomask (transmission-type mask). However, the present invention is also applicable to an EUV mask (reflection-type mask). Exposure using the transmission-type mask is, for example, light exposure (including immersion exposure) or EB exposure. Furthermore, the present invention is also applicable to an original plate for use in a transfer method other than the exposure method (for example, a template for use in imprint method).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An original plate evaluation method for evaluating an original plate comprising a substrate and a plurality of patterns provided on the substrate and corresponding to a plurality of circuit patterns to be formed on a semiconductor substrate, the plurality of patterns including N (N≧2) patterns differing from one another in at least one of a shape and an arrangement position in the substrate, the original plate evaluation method comprising:
   selecting N1 patterns from the N patterns (N1≦N) based on a first selection criterion;
   acquiring measured values for the N1 patterns;
   performing a first determination configured to determine whether or not the acquired measured values satisfy a first specification value;
   selecting N2 patterns from the N patterns (N2≦N) based on a second selection criterion;
   acquiring images relating to the N2 patterns, and predicting the shapes of transfer patterns based on the acquired images;
   performing a second determination configured to determine whether or not the predicted shapes of the transfer patterns satisfy a second specification value; and
   evaluating the original plate based on the first determination and the second determination.

2. The original plate evaluation method according to claim 1, wherein the first selection criterion comprises a criterion in which pattern types are associated with items for measurement of a manufacturing variation of pattern.

3. The original plate evaluation method according to claim 2, wherein the pattern types include a line and space pattern and a hole pattern, and the items for the measurement of the manufacturing variation include a pattern dimension and an average value of the pattern dimension.

4. The original plate evaluation method according to claim 1, wherein the N2 patterns include corner patterns, SRAF (Sub Resolution Assist Feature) patterns, hole patterns, or shapes resulting from OPC (Optical Proximity Correction).

5. A non-transitory computer-readable medium having stored thereon a computer program for evaluating an original plate which comprises a substrate and a plurality of patterns provided on the substrate and corresponding to a plurality of circuit patterns to be formed on a semiconductor substrate, the plurality of patterns including N (N≧2) patterns differing from one another in at least one of a shape and an arrangement position in the substrate, the computer program being executable by a computer, the computer program controlling the computer to execute functions of:
   selecting N1 patterns from the N patterns (N1≦N) based on a first selection criterion;
   acquiring measured values for the N1 patterns;
   performing a first determination configured to determine whether or not the measured values acquired satisfy a first specification value;
   selecting N2 patterns from the N patterns (N2≦N) based on a second selection criterion;
   acquiring images for the N2 patterns, and predicting the shapes of transfer patterns based on the acquired images;
   performing a second determination configured to determine whether or not the predicted shapes of the transfer patterns (hereinafter referred to as the predicted shapes) satisfy a second specification value; and
   evaluating the original plate based on the first determination and the second determination.

6. The medium according to claim 5, wherein the evaluating the original plate comprises
   determining that the original plate is shippable if the acquired values for the N1 patterns are all acceptable and the predicted shapes corresponding to the N2 patterns are all acceptable, and
   determining that the original plate is unshippable if at least one of the acquired values for the N1 patterns is unacceptable or that at least one of the predicted shapes corresponding to the N2 patterns is unacceptable.

7. The medium according to claim 5, wherein the first selection criterion comprises a criterion in which pattern types are associated with items for measurement of a manufacturing variation of pattern.

8. The medium according to claim 7, wherein the pattern types include a line and space pattern and a hole pattern, and the items for the measurement of the manufacturing variation include a pattern dimension and an average value of the pattern dimension.

9. The medium according to claim 5, wherein the N2 patterns include corner patterns, SRAF (Sub Resolution Assist Feature) patterns, hole patterns, or shapes resulting from OPC (Optical Proximity Correction).

10. The medium according to claim 5, wherein the original plate is a transmission-type mask or a reflection-type mask.

11. An original plate manufacturing method comprising:
    preparing mask data on an original plate;
    creating an original plate based on the mask data;
    evaluating the original plate in accordance with an original plate evaluation method for evaluating an original plate comprising a substrate and a plurality of patterns provided on the substrate and corresponding to a plurality of circuit patterns to be formed on a semiconductor substrate, the plurality of patterns including N (N≧2) patterns differing from one another in at least one of a shape and an arrangement position in the substrate;

the original plate evaluation method comprising:

selecting N1 patterns from the N patterns (N1≦N) based on a first selection criterion;

acquiring measured values for the N1 patterns;

performing a first determination configured to determine whether or not the acquired measured values satisfy a first specification value;

selecting N2 patterns from the N patterns (N2≦N) based on a second selection criterion;

acquiring images relating to the N2 patterns, and predicting the shapes of transfer patterns based on the acquired images;

performing a second determination configured to determine whether or not the predicted shapes of the transfer patterns satisfy a second specification value; and evaluating the original plate based on the first determination and the second determination.

12. The original plate manufacturing method according to claim 11, wherein the first selection criterion comprises a criterion in which pattern types are associated with items for measurement of a manufacturing variation of pattern.

13. The original plate manufacturing method according to claim 12, wherein the pattern types include a line and space pattern and a hole pattern, and the items for the measurement of the manufacturing variation include a pattern dimension and an average value of the pattern dimension.

14. The original plate manufacturing method according to claim 11, wherein the N2 patterns include corner patterns, SRAF (Sub Resolution Assist Feature) patterns, hole patterns, or shapes resulting from OPC (Optical Proximity Correction).

* * * * *